United States Patent [19]

Ajit

[11] Patent Number: 5,444,272
[45] Date of Patent: Aug. 22, 1995

[54] THREE-TERMINAL THYRISTOR WITH SINGLE MOS-GATE CONTROLLED CHARACTERISTICS

[75] Inventor: Janardhanan S. Ajit, Redondo Beach, Calif.

[73] Assignee: International Rectifier Corporation, El Segundo, Calif.

[21] Appl. No.: 281,917

[22] Filed: Jul. 28, 1994

[51] Int. Cl.⁶ ............................................. H01L 29/74
[52] U.S. Cl. .................... 257/137; 257/132; 257/133; 257/138; 257/146; 257/154; 257/163
[58] Field of Search ............... 257/132, 133, 137, 146, 257/154, 163, 138

[56] References Cited

U.S. PATENT DOCUMENTS

| | | | |
|---|---|---|---|
| 5,105,244 | 4/1992 | Bauer | 257/133 |
| 5,198,687 | 3/1993 | Bahiga | 257/133 |
| 5,286,981 | 2/1994 | Lilja et al. | 257/133 |
| 5,336,907 | 8/1994 | Nakanishi et al. | 257/133 |

*Primary Examiner*—Ngân V. Ngô
*Attorney, Agent, or Firm*—Ostrolenk, Faber, Gerb & Soffen

[57] ABSTRACT

A MOS-controlled thyristor which has current saturation characteristics and does not have any parasitic thyristor structure. The device requires only a single gate drive and is a three terminal device. The device can be constructed in a cellular geometry. In all embodiments, the device has superior turn-off characteristics and a wider Safe-Operating-Area because the N++ emitter/P base junction is reverse biased during turn-off.

9 Claims, 3 Drawing Sheets

THREE-TERMINAL THYRISTOR WITH SINGLE MOS-GATE CONTROLLED CHARACTERISTICS

BACKGROUND OF THE INVENTION

1. Field of Invention

The present invention relates to a MOS-controlled thyristor and more particularly, to a three-terminal MOS-controlled thyristor with current saturation characteristics and without any parasitic thyristor structure.

2. Description of the Related Art

Power semiconductor structures that combine bipolar conducting mechanisms with a MOS control are well known. The insulated gate bipolar transistor (IGBT) is an example of such a device, in which the base current of a bipolar structure is controlled via an integrated MOSFET. The IGBT is best suited for high-voltage power electronic applications with blocking voltages in the range of 600 volts. IGBTs capable of handling higher voltages have a higher on-state voltage drop, which is disadvantageous. Since a lower on-state voltage drop is achievable by carrying the on-state current through a thyristor structure, MOS-gated thyristors have received considerable interest for high current, high voltage applications.

Two types of MOS-gated thyristors are the MOS-controlled thyristor (MCT) and the emitter-switched thyristor (EST). In the MCT, as described in an article by V.A.K. Temple, *IEEE International Electron Device Meeting (IEDM) Technical Digest*, San Francisco (December 1984), pp. 282-85, a cathode short circuit is switched via a MOS gate. However, the commercial development of the MCT has been limited because of complex fabrication requirements and current filamentation problems during turn-off, and because it does not have current saturation characteristics.

The EST, as shown in FIG. 1, basically consists of a MOSFET in series with a thyristor, and is said to be "emitter-switched." The EST lends itself to easier fabrication than the MCT. While the EST exhibits current saturation characteristics, it is, however, limited by an inherent parasitic thyristor, shown in FIG. 1, which bypasses the gate-controlled n-channel MOSFET. Accordingly, a need exists for an EST which has current saturation characteristics, but is not limited by a parasitic thyristor structure within the device.

SUMMARY OF THE INVENTION

The present invention overcomes the disadvantages of the prior and achieves the foregoing objective by providing a MOS-controlled thyristor which, in a first embodiment, comprises a wafer of semiconductor material having first and second spaced, parallel planar surfaces. A relatively lightly doped N-type layer extends from the first semiconductor surface, while a P-type layer extends from the second semiconductor surface.

A P-type base is formed in the relatively lightly doped N-type layer and extends from the first semiconductor surface to a first depth beneath the first semiconductor surface. An N-type emitter region formed in the P-type base extends from the first semiconductor surface to a second depth beneath the semiconductor surface which is shallower than the first depth to create an N-type emitter/P-type base junction, the N-type emitter region being radially inwardly spaced along the first semiconductor surface along edges of the P-type base, such that the edges of the P-type base extend to the first semiconductor surface, thereby defining a first channel region along a first of the edges. A metal strap is disposed on the first semiconductor surface and connects the emitter region to the P-type base along a second of the edges.

First and second P-type regions are formed in the relatively lightly doped N-type layer and extend from the first surface of the wafer. The first and second P-type regions are laterally spaced from the second and first edges of the P-type base, respectively, such that the relatively lightly doped N-type layer which extends to the first semiconductor surface therethrough forms second and third channel regions.

A first gate insulation layer is disposed on the first semiconductor surface and extends over at least the second channel region. A first gate is disposed on the first gate insulation layer and overlies the second channel region.

A second gate insulation layer is disposed on the first semiconductor surface and extends over at least the first and third channel regions. A second gate is disposed on the second gate insulation layer means and overlies the first and third channel regions.

A gate electrode is connected to the second insulted gate.

An anode electrode is connected to the P-type layer disposed on the second semiconductor surface. A cathode electrode is connected to the first and second P-type regions on the first semiconductor surface and is also connected to the first insulated gate.

The MOS-controlled thyristor of the present invention preferably further includes an N-type layer disposed between the P-type layer and the relatively lightly doped N-type layer. The P-type layer and the N-type emitter are preferably relatively highly doped.

In the MOS-controlled thyristor of the first embodiment described above, the N-type emitter has a lateral length which creates a sufficient voltage drop in the P-type base to forward bias the N-type emitter/P-type base junction when the thyristor is in an on-state, which is necessary for the thyristor to latch on. Consequently, the P-type base must be made relatively long with light doping. An alternative embodiment eliminates this requirement.

In the alternative embodiment, the first and second P-type regions are adjacent to and laterally spaced from one another, and only the second P-type region is adjacent to and laterally spaced from the P-type base region. A third P-type region is adjacent to and laterally spaced from the P-type base region. The metal strap in this embodiment connects the N-type emitter to the second P-type base region. A first insulated gate overlies the channel region in the N-type layer between the first and second P-type regions, and a second insulated gate overlies the channel region in the N-type layer between the second P-type region and the P-type base. The second insulated gate also overlies the channel region formed at the edge of the P-type base between the N-type emitter and the relatively lightly doped N-type layer. A third insulated gate overlies the channel region in the N-type layer between the P-type base and the third P-type region. The third insulated gate also overlies the channel region formed at the second edge of the P-type base between the N-type emitter and the relatively lightly doped N-type layer. The third insulated gate is electrically connected to the second insulated gate or, optionally, the second insulated gate can be left floating or be absent. The first and third P-type regions and the first insulated gate are contacted by the cathode metal on the first semiconductor surface. An anode electrode is connected to the P-type layer disposed on the second semiconductor surface. A gate electrode is connected to the third insulated gate.

As in the first embodiment, an N-type layer is preferably disposed between the P-type layer and the relatively lightly doped N-type layer.

The first, second and third P-type regions, and the P-type base are preferably relatively highly doped, and the P-type layer and said N-type emitter are preferably very highly doped. Optionally, a relatively lightly doped P-type region may be provided in the channel region between the first and second P-type regions to form a depletion p-channel MOSFET. Also optionally, the third P-type region can be eliminated.

Advantageously, all embodiments of the present invention have current saturation characteristics without any parasitic thyristor structure. Superior turn-off and a wider Safe-Operating-Area are achieved by the present invention because all embodiments have the emitter/base junction reverse-biased during turn-off. Furthermore, the junction patterns are easily fabricated.

Other features and advantages of the present invention will become apparent from the following description of the invention which refers to the accompanying drawings.

DETAILED DESCRIPTION OF THE PREFERRED EMBODIMENTS

Figure 1:
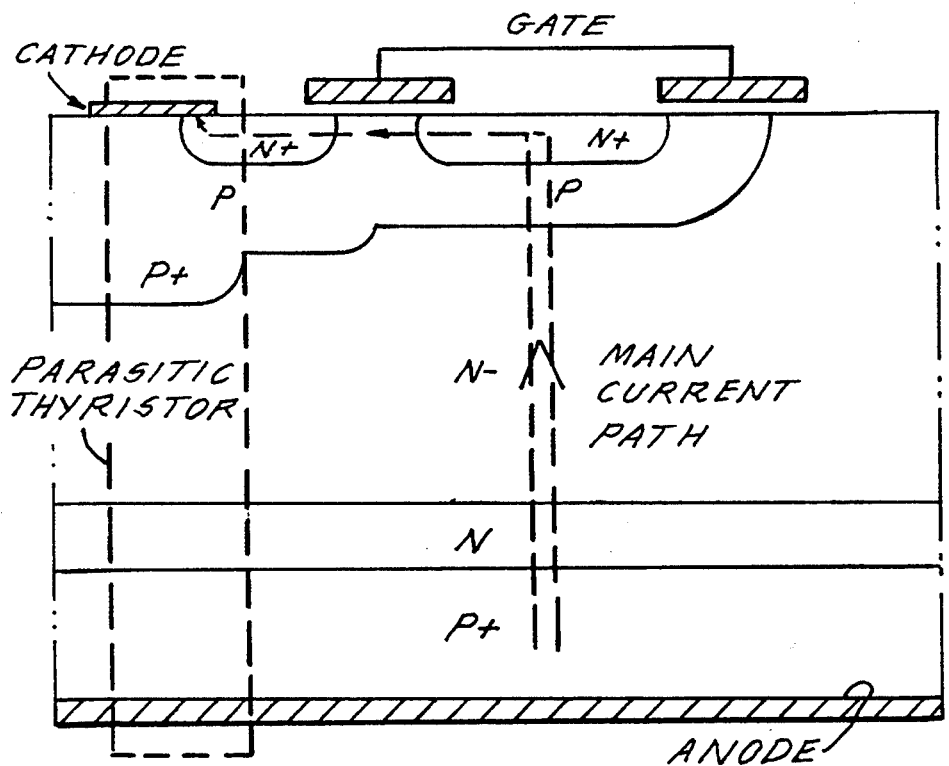
FIG. 1 is a cross-sectional view of a typical prior art Emitter Switched Thyristor (EST).
Figure 2:
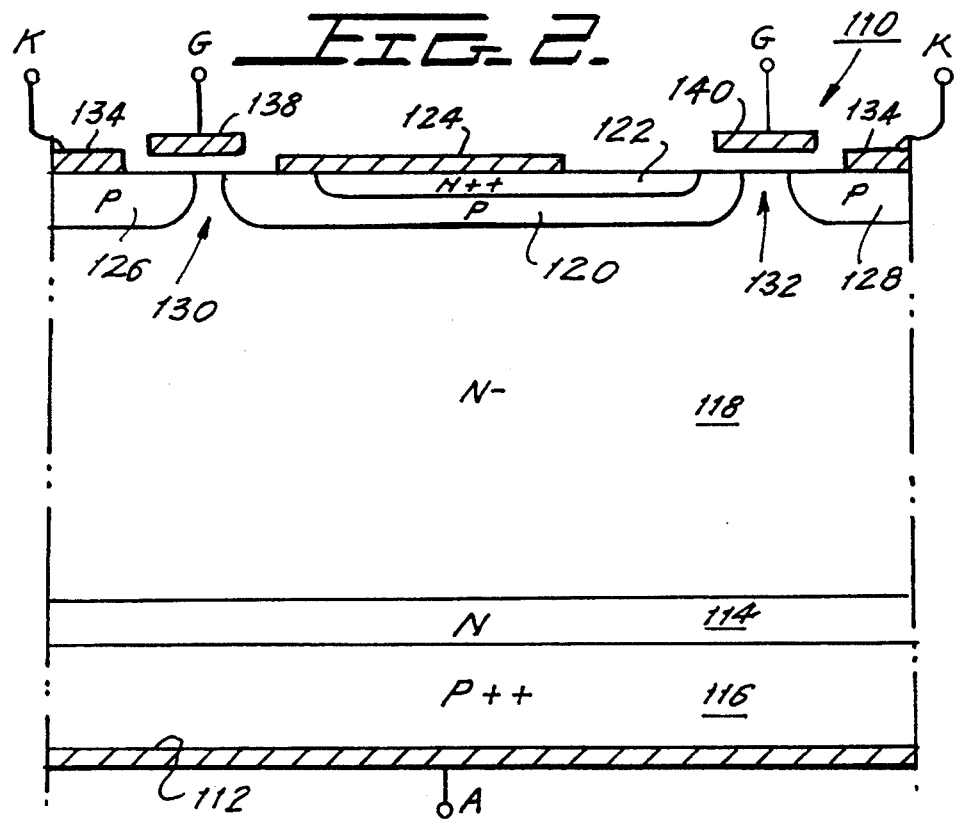
FIG. 2 is a cross-sectional view of a first embodiment of the present invention.

A first embodiment of the MOS-controlled thyristor of the present invention is shown in FIG. 2. MOS-controlled thyristor 110 is a vertical conduction device.

An N-type layer 114 and a very highly doped P++ region 116 are disposed on the underside of an N− layer 118. For lower voltage applications (<1200 V), N− layer 118 is preferably epitaxially grown on an N epi/P++ substrate. For higher voltage applications (>1200 V), N− layer 118 is preferably the starting substrate material and N layer 114 and P++ region 116 are backside diffusions.

An anode electrode 112 on the bottom surface of the device covers P+ region 116. Anode electrode 112 is coupled to an anode terminal A.

The layer thicknesses and concentrations depend on the device blocking voltage. For 2,500 V device, the doping density and thickness of N− drift region are in the range of $2 \times 10^{13}$ cm$^{-3}$ and 500 µm, respectively. The doping density of P++ region 116 is preferably greater than $5 \times 10^{19}$ cm$^{-3}$, with a thickness greater than 1 µm. The doping density of N layer 114 is preferably approximately $5 \times 10^{17}$ cm$^{-3}$, with a thickness of approximately 7 µm.

Disposed within N− layer 118 is a P-type base 120, which also forms the source of the p-channel MOSFET of the device, as described in further detail below. An N++ emitter region 122 is disposed within P-base 120, and is electrically shorted thereto by a floating metal strap 124 (unconnected to any electrode of the device) on the upper surface of the device.

P-base 120 is surrounded by P regions 126, 128, but is separated therefrom by relatively small regions of N− layer 118 which extend to the surface of the wafer to form respective channel regions 130, 132.

A first insulated gate 138 overlies channel region 130. A second insulated gate 140, coupled to gate terminal G, overlies channel region 132 and, in addition, overlies the portion of P base 120 between N++ emitter region 122 and channel region 132 at the upper surface of the wafer. Gates 138, 140 are preferably comprised of polysilicon and are insulated from the upper surface of the device by a layer of oxide (not shown in FIG. 2). A cathode electrode 134, coupled to a cathode terminal K, makes ohmic contact to P regions 126 and 128, and to first insulated gate 138.

The operation of device 110 shown in FIG. 2 is as follows. In the on-state (with anode 112 at a positive potential with respect to cathode 134), the voltage applied to gate 140 should be sufficiently positive to turn-on the n-channel MOSFET (in P base 120) under gate 140. This causes the P base 120 to rise in potential when the anode voltage is increased. When the potential of the P base 120 increases such that the potential difference between gate 138 and P base 120 is greater in magnitude than the threshold voltage of the p-channel MOSFET under gate 138, the p-channel MOSFET under gate 138 turns-on and connects the P base 120 to the P region 126 through the inversion p-channel formed at surface of N− layer 130. This triggers thyristor 110 to the on-state by creating a conduction path from anode to cathode (upward in FIG. 2) via P++ region 116, N layer 114, N− layer 118, through the n-channel in P base 120 at the surface of the wafer (created by gate 140), across N++ emitter 122, through metal strap 124 to P base 120, through the p-channel (created by gate 138) in channel region 130, and through P region 126 to cathode 134.

The lateral length of N++ emitter 122 is designed to create a sufficient voltage drop so that part of the N++ emitter/P base junction becomes forward biased in the on-state to turn on the thyristor formed by regions 122, 120, 118, 114, and 116, whereby the main thyristor current will bypass the n-channel under gate 140 and instead flow directly upward through the device from P++ region 116 through layers 114, 118, and 120 to N++ emitter 122 and then through the floating metal strap 124 to 120, then through p-channel MOSFET under gate 138 and then through P region 126 to cathode 134.

Since the p-channel MOSFET under gate 138 is in series with the thyristor (116-114-118-120-122), the current through the device is limited by the saturation current of the p-channel MOSFET under gate 138. Thus, the device has current saturation characteristics.

To turn-off the device, a sufficiently negative potential is applied to gate 140 with respect to cathode 134 (to turn-off the n-channel MOSFET under gate 140 and turn-on the p-channel MOSFET under gate 140, thereby coupling P base 120 to P region 128, which is in turn electrically connected to the cathode. These respective potentials on gates 138, 140 are maintained in the forward blocking condition (anode at a positive potential with respect to cathode). The negative potential on gate 140 results in a high breakdown voltage for the device, because this keeps P base 120 of the thyristor at a lower potential compared to the N++ emitter 122.

It should be noted that, during the forward blocking condition, the N++ emitter/P base junction is reverse biased. Superior breakdown, turn-off characteristics and a wider Safe Operating Area are achieved by the present invention because this is similar to the case of the emitter-open turn off. In this regard, see, e.g., B. Jackson and D. Chen, "Effects of emitter-open switching on the turn-off characteristics of high voltage power transistors", *Power Electronics Specialist Conference*, June 1980.

The on-state voltage drop of the high-voltage MOS-controlled thyristor of the present invention is the sum of the voltage drop across the high voltage thyristor (112-116-114-118-120-122) and the voltage drop across the low voltage p-channel MOSFET (120-130-126-134) under gate 138. The voltage drop across the high voltage thyristor does not increase much when the device is designed to support higher breakdown voltage. In contrast, in an IGBT, the on-state voltage drop increases when the IGBT is designed for higher breakdown voltages. This is because, in the IGBT, only the bottom part of the drift region is conductivity modulated, while in a thyristor the entire drift region is conductivity modulated. Hence, advantageously, the MOS-controlled thyristor of the present invention has a lower forward voltage drop than an IGBT for the same current for higher breakdown voltage (>1200 V) devices.

Additionally, advantageously, the present invention requires no short circuit protection because of its on-state current saturation characteristics, described previously. This is a major advantage compared to a MCT. Also, advantageously, the present invention does not have any parasitic thyristor structure to degrade performance. This is a major advantage compared to the prior-art EST.

Finally, the present invention advantageously has lower turn-off losses as compared to a MCT. As stated previously, in the device of the present invention, the P base is connected to ground potential through the lateral p-channel MOSFET, reverse biasing the N++ emitter/P base junction. This inactivates the NPN transistor by providing a reverse base drive, leading to disruption of the thyristor action faster as compared to a MCT and hence a faster decrease in current. The turn-off time of the device of the present invention is thus close to that of an IGBT (which has approximately an open-base PNP transistor turn-off time).

The embodiment of the present invention described above and shown in FIG. 2 relies upon the lateral voltage drop along P base 120 to forward-bias the NPN transistor to latch the thyristor. Consequently, P base 120 must be made relatively long with light doping. An alternative embodiment, shown in FIG. 3, eliminates this requirement.

Figure 3:
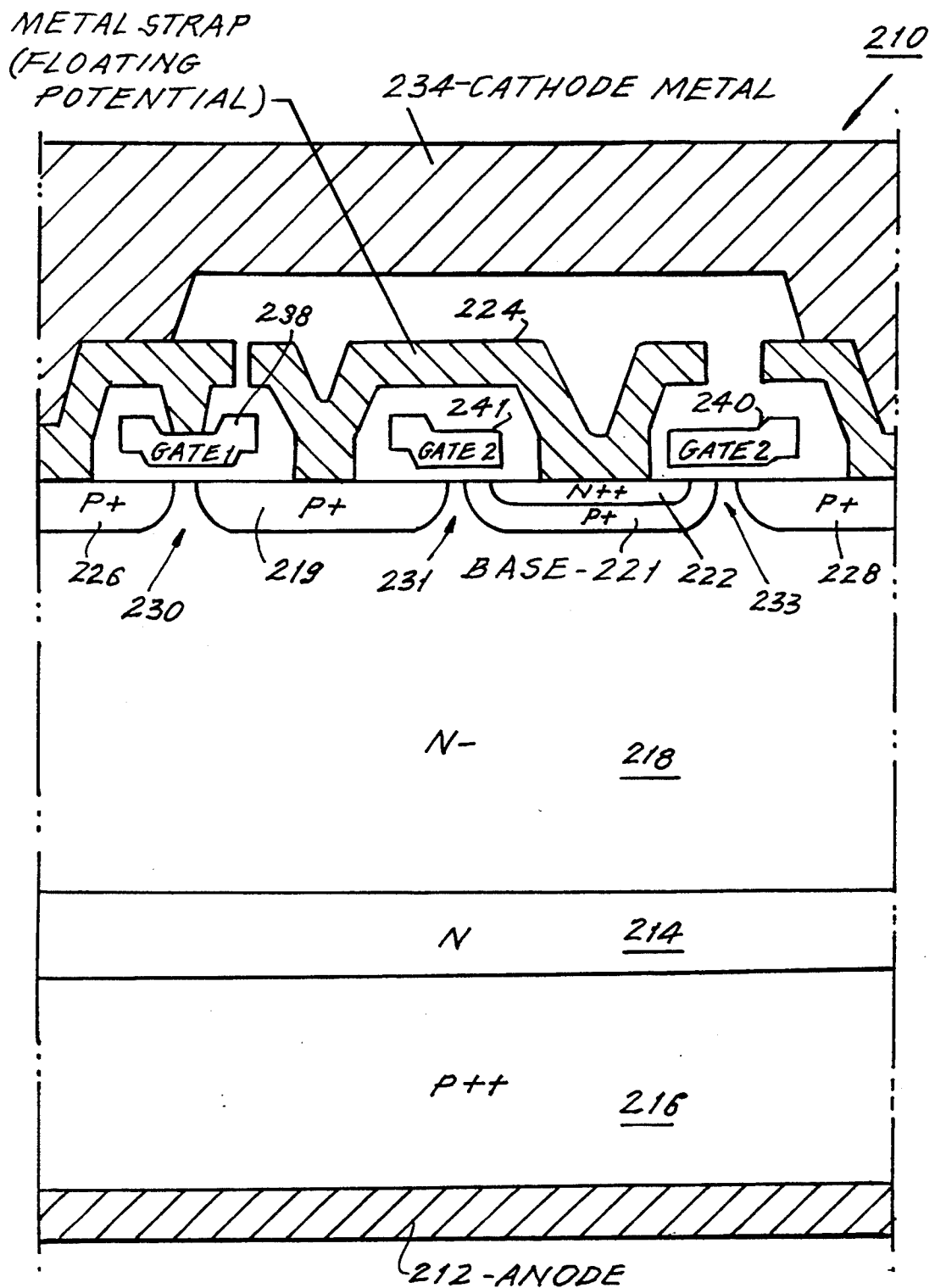
FIG. 3 is a cross-sectional view of a second embodiment of the present invention.

As in FIG. 2, the MOS-controlled thyristor 210 of FIG. 3 is a vertical conduction device with an N layer 214 and a very highly doped P++ region 216 disposed on the underside of an N− layer 218. An anode 212 on the bottom surface of the device covers P++ region 216. The layer thicknesses and concentrations depend on the device blocking voltage and are the same as the device of FIG. 2.

Disposed within N− layer 218 are: 1) a P+ base 221; 2) a P+ region 219 which forms the source of the p-channel MOSFET of the device, as described in further detail below; and 3) P+ regions 226 and 228, which form the respective drains of p-channel MOSFETs of the device, as described in further detail below.

An N++ emitter region 222 is disposed within a P+ base 221, and is electrically shorted to P+ region 219 by a floating metal strap 224 (unconnected to any electrode of the device) on the upper surface of the device.

P+ regions 226 and 219, P+ regions 219 and 221, and P+ regions 221 and 228 are separated by relatively small regions of N− layer 218 which extend to the surface of the wafer to form respective channel regions 230, 231, 233.

A first insulated gate 238 overlies channel region 230. A second insulated gate 240 overlies channel region 233 and, in addition, Overlies the portion of P+ base 221 between N++ emitter region 222 and channel region 233 at the upper surface of the wafer. A third insulated gate 241 overlies channel region 231 and, in addition, overlies the position of P+ base 221 between N++ emitter region 222 and channel region 231 of the upper surface of the wafer. Gates 238, 240, 241 are preferably comprised of polysilicon and are insulated from the upper surface of the device by a layer of oxide (not shown in FIG. 3). Gates 240 and 241 may be tied together (connected electrically). Gate 240 is contacted by a gate electrode. A cathode electrode 234 makes ohmic contact to P+ regions 226 and 228, and to first insulated gate 238.

The operation of device 210 shown in FIG. 3 is as follows. In the on-state (with anode 212 at a positive potential with respect to cathode 234), the voltage applied to gates 241 and 240 should be sufficiently positive to turn-on the n-channel MOSFETs (in P+ base 221) under gates 241 and 240. This causes the P+ region 219 to rise in potential when the anode voltage is increased. When the potential of the P+ region 219 increases such that the potential difference between gate 238 and P+ region 219 is greater in magnitude than the threshold voltage of the p-channel MOSFET under gate 238, the p-channel MOSFET under gate 238 turns-on and connects the P+ region 219 to the P+ region 226 through the inversion p-channel formed at surface of N− layer 230.

In this situation, N++ emitter 222 is connected to ground potential by metal strap 224 and through the lateral PMOS created by the inversion of channel region 230, and the base drive for the vertical PNP transistor formed by layers 216-214-218-221 is provided through the n-channel MOSFETs under gates 240, 241. When the P++ region/N junction is forward biased by about 0.7 volts, the P++ region 216 starts injecting holes which supplies the base drive for the NPN transistor formed by layers 222-221-218-214, causing the thyristor formed by layers 216-214-218-221-222 to go into the latched state.

Thus, this triggers thyristor 210 to the on-state by creating a conduction path from anode to cathode (upward in FIG. 3) via P++ region 216, N layer 214, N− layer 218, through the n-channels in P+ base 221 at the surface of the wafer (created by gates 241 and 240), across N++ emitter 222, through metal strap 224 to P+ region 219, through the p-channel (created by gate 238) in channel region 230, and through P+ region 226 to cathode 234.

After the thyristor formed by regions 216, 214, 218, 221 and 222 is turned-on, a major portion of the current will bypass the n-channel under gate 241 and 240, and instead flow directly upward through the device from P++ region 216 through regions 214, 218, 221 to N++ emitter 222 and then through the floating metal strap 224 to P+ region 219, through the p-channel MOSFET under gate 238 to P+ region 226 and then to cathode 234. Since the p-channel MOSFET under gate 238 is in series with the thyristor (216-214-218-221-222), the current through the device is limited by the saturation current of the p-channel MOSFET under gate 238. Thus, the device of FIG. 3, like the device of FIG. 2, has current saturation characteristics.

Advantageously, the thyristor can be turned-off by merely reducing the voltages of gates 240, 241 to a sufficiently negative value (this turns-off the n-channel MOSFETs under gate 240 and 241 and turns-on the p-channel MOSFET under gate 240, thereby coupling P+base 221 to P+ region 228, which is in turn electrically connected to the cathode). These respective potentials on gates 240, 241 are maintained in the forward blocking condition (anode at a positive potential with respect to cathode). The negative potential on gate 240 results in a high breakdown voltage for the device, because this keeps P+ base 221 of the thyristor at a lower potential compared to the N++ emitter 222.

Figure 4:
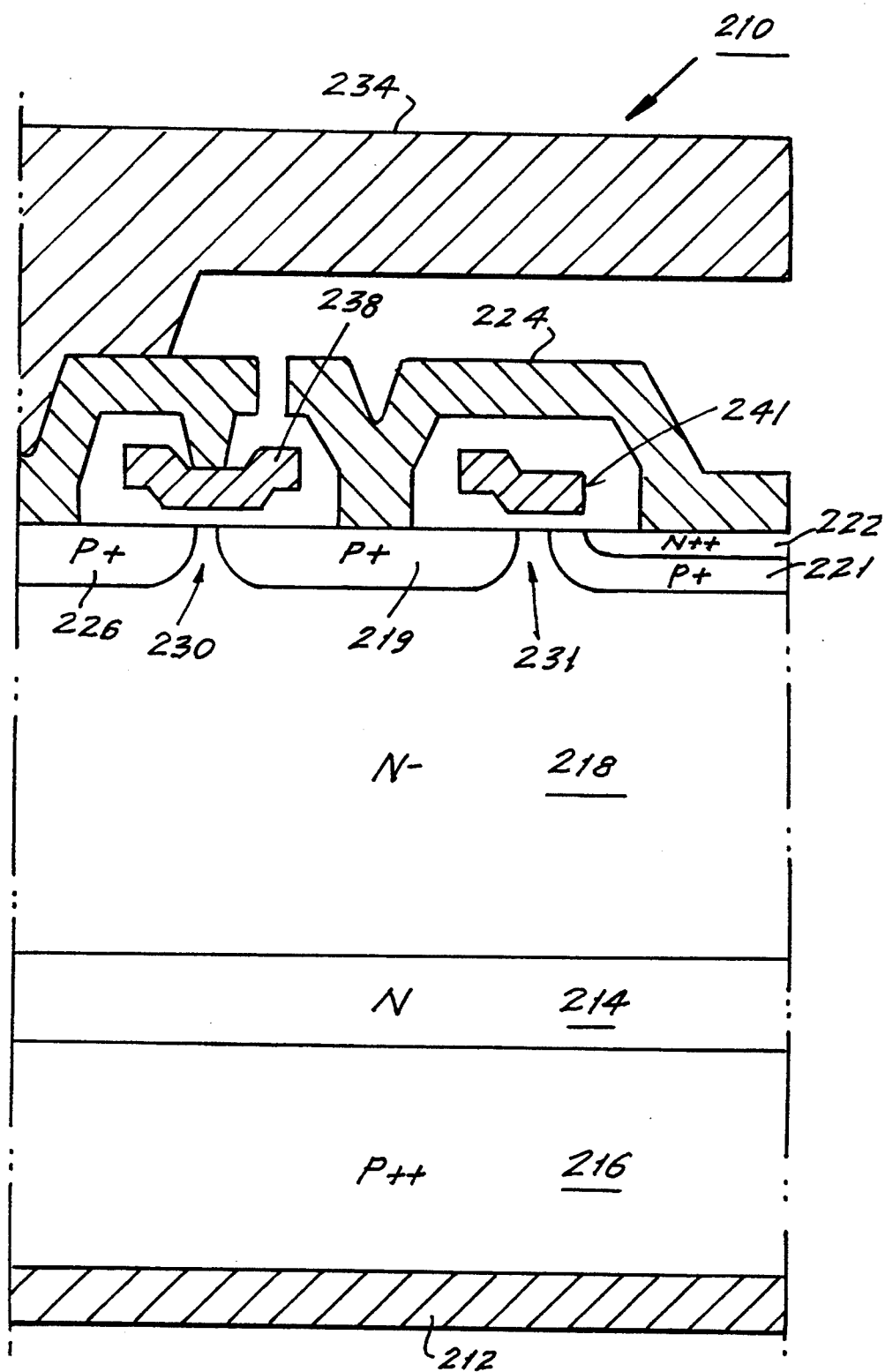
FIG. 4 is a cross-sectional view of a variation of the embodiment of FIG. 3 without a third P-type region and without an associated third gate.
Figure 1:
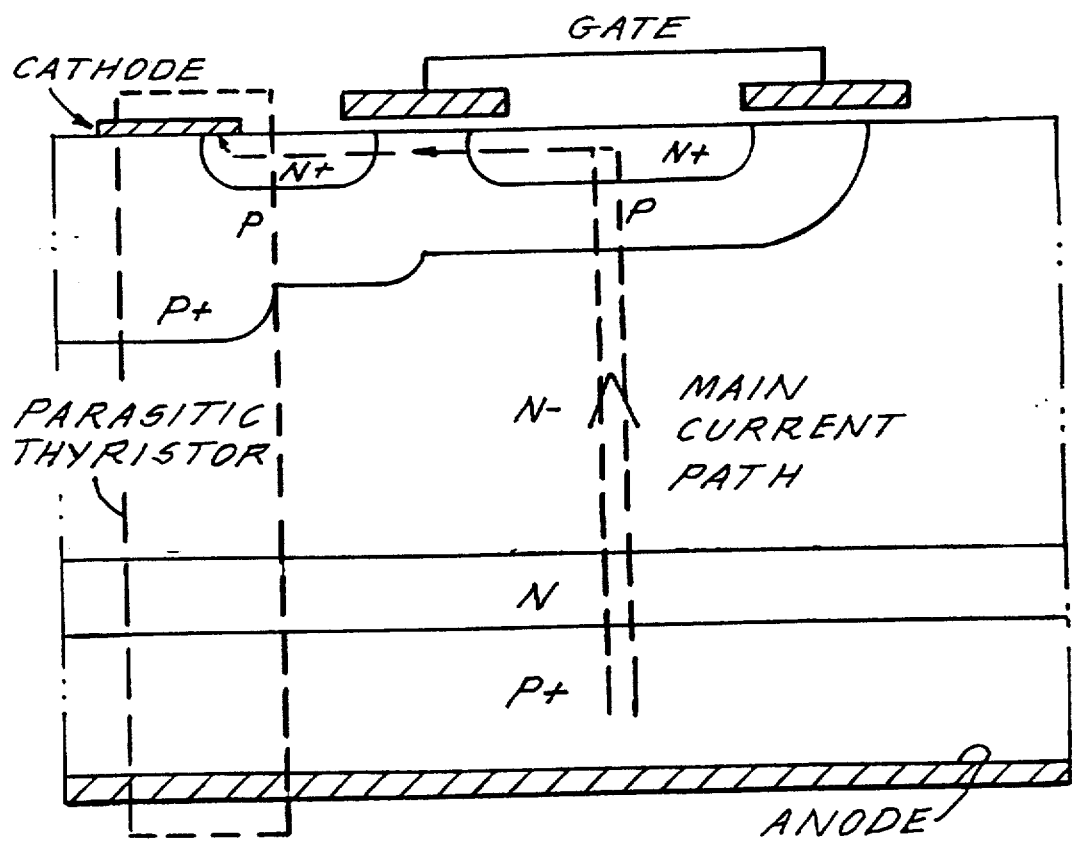
Figure 2:
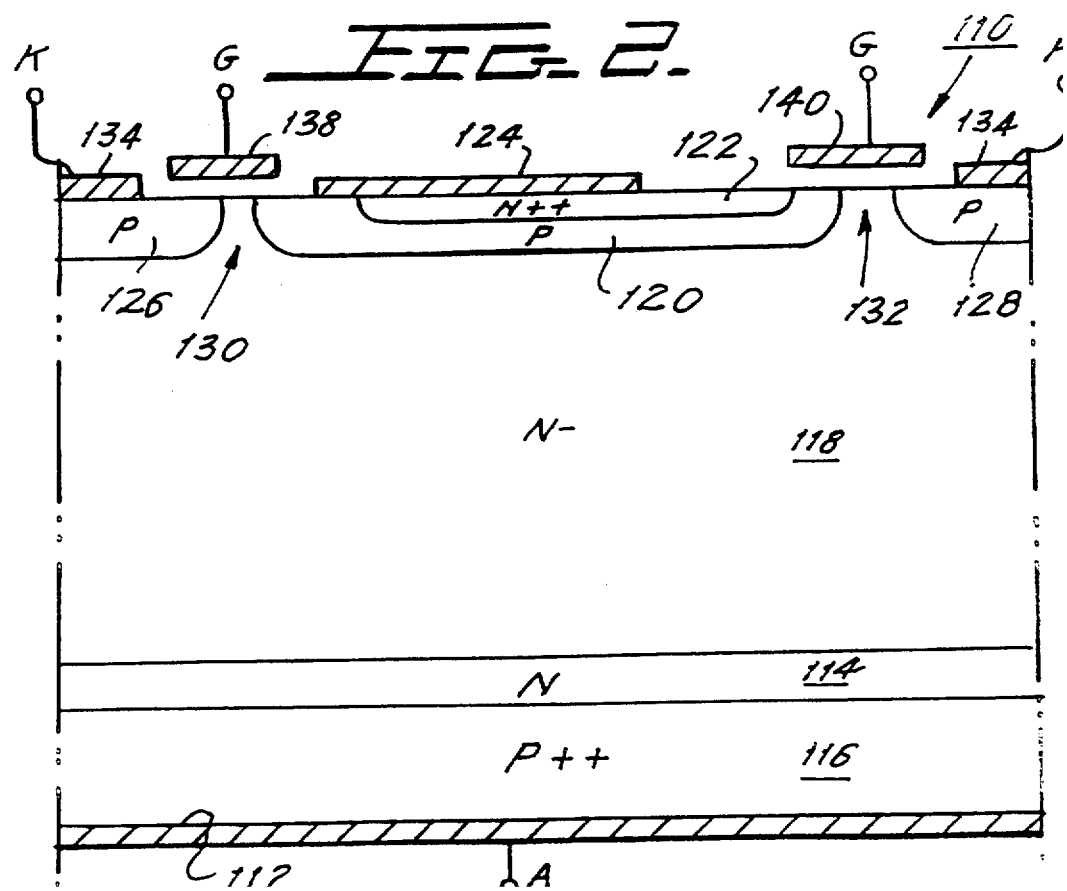

FIG. 4 shows a variation of the structure of FIG. 3 by eliminating the P+ region 228, associated cathode metal 234 contact to this region, gate 240 and channel region 233. In this embodiment, during turn-off and forward blocking state, the N++ emitter 222 is merely shorted to the P+ base 221 through the floating metal strap 224 and the p-channel region 231 under gate 241.

Another variation of the structure of FIG. 3 is obtained by eliminating the gate 241 or by leaving it electrically floating.

Although the present invention has been described in relation to particular embodiments thereof, many other variations and modifications (such as using trench gates instead of surface planar gates and different gate and channel region layout) will become apparent to those skilled in the art. It is preferred, therefore, that the present invention be limited not by the specific disclosure herein, but only by the appended claims.

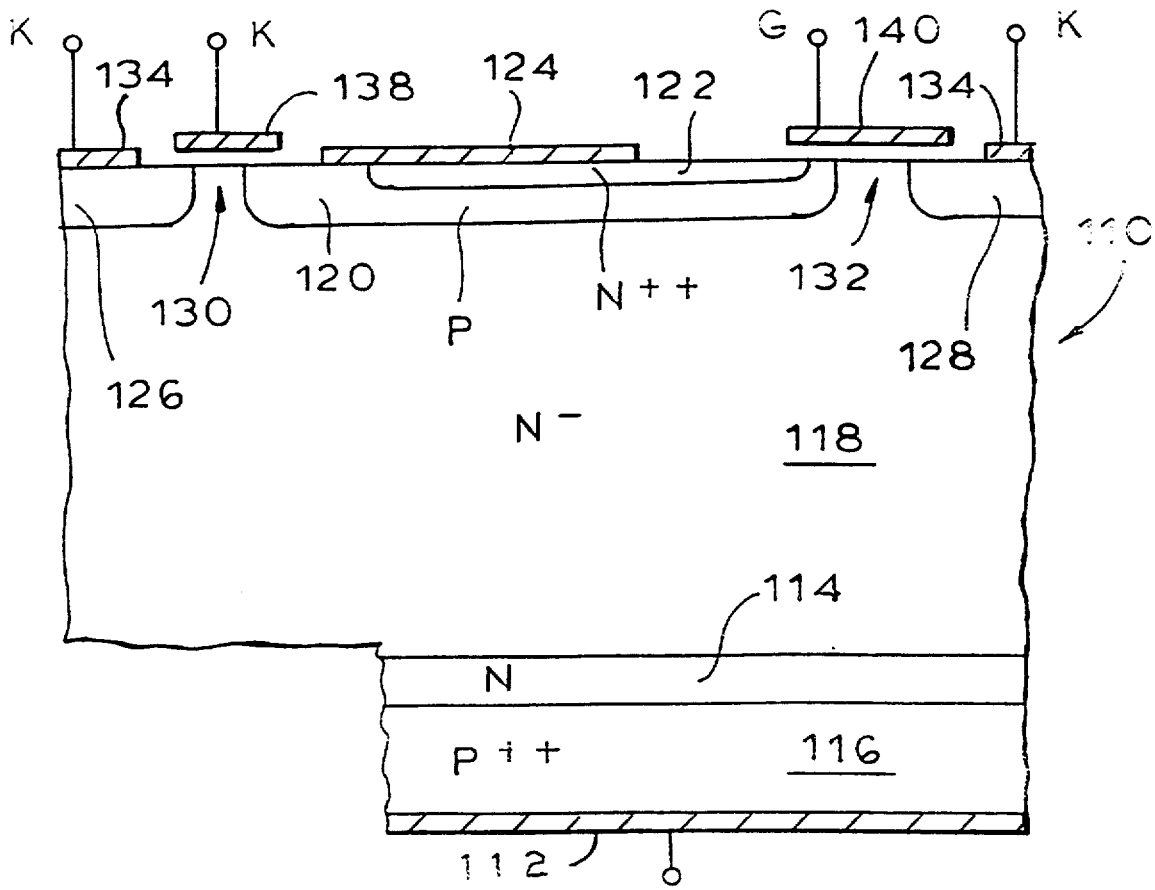

What is claimed is:

1. A MOS-controlled thyristor, comprising:
   a wafer of semiconductor material having first and second spaced, parallel planar surfaces, at least a portion of the thickness of the wafer which extends from said first semiconductor surface comprising a relatively lightly doped N-type layer for receiving junctions, at least a portion of the thickness of said wafer which extends from said second semiconductor surface comprising a relatively highly doped P-type layer;
   a P-type base formed in said relatively lightly doped N-type layer and extending from said first semiconductor surface to a first depth beneath said first semiconductor surface;
   an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along edges of said P-type base, such that said edges of said P-type base extend to said first semiconductor surface, thereby defining a first channel region along a first of said edges, a metal strap being disposed on said first semiconductor surface and connecting said emitter region to said P-type base along a second of said edges;
   first and second P-type regions formed in said relatively lightly doped N-type layer and extending from said first surface of said wafer, said first and second P-type regions being laterally spaced from said second and first edges of said P-type base, respectively, to form second and third channel regions in said relatively lightly doped N-type layer;
   first gate insulation layer means on said first 35 semiconductor surface disposed at least on said second channel region;
   first gate means on said first gate insulation layer means and overlying said second channel region;
   second gate insulation layer means on said first semiconductor surface disposed at least on said first and third channel regions;
   second gate means on said second gate insulation layer means and overlying said first and third channel regions;
   anode electrode means connected to said P-type layer disposed on said second semiconductor surface;
   cathode electrode means connected to said first and second P-type regions on said first semiconductor surface, and to said first gate; and
   gate electrode means connected to said second gate.

2. The MOS-controlled thyristor of claim 1, further comprising a N-type layer disposed between said P-type layer and said relatively lightly doped N-type layer.

3. The MOS-controlled thyristor of claim 1, wherein said N-type emitter has a lateral length which creates a sufficient voltage drop in said P-type base to forward bias said N-type emitter/P-type base junction when said thyristor is in an on-state.

4. The MOS-controlled thyristor of claim 1, wherein said P-type layer and said N-type emitter are relatively highly doped.

5. A MOS-controlled thyristor, comprising:
   a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped P-type layer;
   a P-type base formed in said relatively lightly doped N-type layer and extending from said first semiconductor surface to a first depth beneath said first semiconductor surface;
   an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along edges of said P-type base, such that said edges of said P-type base extend to said first semiconductor surface, thereby defining first and second channel regions along said edges;
   first and second P-type regions formed in said relatively lightly doped N-type layer and extending from said first surface of said wafer, said first and second P-type regions being laterally spaced from each other and from said P-type base to form respective third and fourth channel regions in said relatively lightly doped N-type layer, a metal strap being disposed on said first semiconductor surface and connecting said N-type emitter region to said second P-type region;

a third P-type region formed in said relatively lightly doped N-type layer and extending from said first surface of said wafer, said third P-type region being laterally spaced from said P-type base to form a fifth channel region in said N-type layer;

first gate insulation layer means on said first semiconductor surface disposed at least on said third channel region;

first gate means on said first gate insulation layer means and overlying said third channel region;

second gate insulation layer means on said first surface disposed at least on said first and fourth channel regions;

second gate means on said second gate insulation layer means and overlying said first and fourth channel regions;

third gate insulation layer means on said first surface disposed at least on said second and fifth channel regions;

third gate means on said third gate insulation layer means and overlying said second and fifth channel regions;

anode electrode means connected to said P-type layer disposed on said second semiconductor surface;

cathode electrode means connected to said first and third P-type regions on said first semiconductor surface, and to said first gate; and gate electrode means connected to said second and third gates.

6. The MOS-controlled thyristor of claim 5, further comprising a N-type layer disposed between said P-type layer and said relatively lightly doped N-type layer.

7. A MOS-controlled thyristor, comprising:

a wafer of semiconductor material having first and second spaced, parallel planar surfaces, at least a portion of the thickness of said wafer which extends from said first semiconductor surface comprising a relatively lightly doped N-type layer for receiving junctions, at least a portion of the thickness of said wafer which extends from said second semiconductor surface comprising a relatively highly doped P-type layer;

a P-type base formed in said relatively lightly doped N-type layer and extending from said first semiconductor surface to a first depth beneath said first semiconductor surface;

an N-type emitter region formed in said P-type base and extending from said first semiconductor surface to a second depth beneath said semiconductor surface which is shallower than said first depth to create an N-type emitter/P-type base junction, said N-type emitter region being radially inwardly spaced along said first semiconductor surface along one edge of said P-type base, such that said one edge of said P-type base extends to said first semiconductor surface, thereby defining a first channel region along said edge;

first and second P-type regions formed in said relatively lightly doped N-type layer and extending from said first surface of said wafer, said first and second P-type regions being laterally spaced from each other and said second P-type region being laterally spaced from said P-type base to form respective second and third channel regions in said relatively lightly doped N-type layer, a metal strap being disposed on said first semiconductor surface and connecting said N-type emitter region to said second P-type region;

first gate insulation layer means on said first semiconductor surface disposed at least on said second channel region;

first gate means on said first gate insulation layer means and overlying said second channel region;

second gate insulation layer means on said first surface disposed at least on said first and third channel regions;

second gate means on said second gate insulation layer means and overlying said first and third channel regions;

anode electrode means connected to said P-type layer disposed on said second semiconductor surface;

cathode electrode means connected to said first P-type region on said first semiconductor surface, and to said first gate; and gate electrode means connected to said second gate.

8. The MOS-controlled thyristor of claim 5, wherein said first, second and third P-type regions, and said P-type base are relatively highly doped, and said P-type layer and said N-type emitter are relatively very highly doped.

9. The MOS-controlled thyristor of claim 5, wherein said second gate means is electrically floating or absent.

* * * * *

UNITED STATES PATENT AND TRADEMARK OFFICE
CERTIFICATE OF CORRECTION

PATENT NO. : 5,444,272

DATED : August 22, 1995

INVENTOR(S) : Janardharan S. AJIT

It is certified that error appears in the above-identified patent and that said Letters Patent is hereby corrected as shown below:

The Title page, showing an illustrative figure, should be deleted and substitute therefor the attached title page.

Drawings:

Delete Drawing sheet 1, Fig. 2, and substitute therefor the Drawing sheet 1, Fig. 2, as shown on the attached page.

Signed and Sealed this

Sixteenth Day of April, 1996

Attest:

BRUCE LEHMAN

Attesting Officer

Commissioner of Patents and Trademarks

United States Patent [19]

Ajit

[11] Patent Number: 5,444,272
[45] Date of Patent: Aug. 22, 1995

[54] THREE-TERMINAL THYRISTOR WITH SINGLE MOS-GATE CONTROLLED CHARACTERISTICS

[75] Inventor: Janardhanan S. Ajit, Redondo Beach, Calif.

[73] Assignee: International Rectifier Corporation, El Segundo, Calif.

[21] Appl. No.: 281,917

[22] Filed: Jul. 28, 1994

[51] Int. Cl.6 ............................................ H01L 29/74
[52] U.S. Cl. ........................... 257/137; 257/132; 257/133; 257/138; 257/146; 257/154; 257/163
[58] Field of Search ............... 257/132, 133, 137, 146, 257/154, 163, 138

[56] References Cited

U.S. PATENT DOCUMENTS

| | | | |
|---|---|---|---|
| 5,105,244 | 4/1992 | Bauer | 257/133 |
| 5,198,687 | 3/1993 | Bahiga | 257/133 |
| 5,286,981 | 2/1994 | Lilja et al. | 257/133 |
| 5,336,907 | 8/1994 | Nakanishi et al. | 257/133 |

*Primary Examiner*—Ngân V. Ngô
*Attorney, Agent, or Firm*—Ostrolenk, Faber, Gerb & Soffen

[57] ABSTRACT

A MOS-controlled thyristor which has current saturation characteristics and does not have any parasitic thyristor structure. The device requires only a single gate drive and is a three terminal device. The device can be constructed in a cellular geometry. In all embodiments, the device has superior turn-off characteristics and a wider Safe-Operating-Area because the $N^{++}$ emitter/P base junction is reverse biased during turn-off.

9 Claims, 3 Drawing Sheets